United States Patent
Xiu

(10) Patent No.: US 10,582,597 B2
(45) Date of Patent: Mar. 3, 2020

(54) SIGNAL GENERATING CIRCUIT AND SIGNAL GENERATING METHOD, DRIVING CIRCUIT OF LIGHT EMITTING DEVICE AND DISPLAY DEVICE

(71) Applicant: BOE TECHNOLOGY GROUP CO., LTD., Beijing (CN)

(72) Inventor: Liming Xiu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/080,827

(22) PCT Filed: Dec. 15, 2017

(86) PCT No.: PCT/CN2017/116510
§ 371 (c)(1),
(2) Date: Aug. 29, 2018

(87) PCT Pub. No.: WO2018/176921
PCT Pub. Date: Oct. 4, 2018

(65) Prior Publication Data
US 2019/0261472 A1    Aug. 22, 2019

(30) Foreign Application Priority Data

Mar. 29, 2017    (CN) .......................... 2017 1 0197909

(51) Int. Cl.
*H05B 41/392* (2006.01)
*H05B 33/08* (2006.01)
(Continued)

(52) U.S. Cl.
CPC ......... *H05B 41/3927* (2013.01); *H03K 3/017* (2013.01); *H05B 33/0815* (2013.01); *H05B 33/0824* (2013.01); *G09G 3/3406* (2013.01)

(58) Field of Classification Search
CPC ............ H05B 33/0815; H05B 33/0824; H05B 41/3927; H03K 3/017; G09G 3/3406
See application file for complete search history.

(56) References Cited

U.S. PATENT DOCUMENTS

| 2009/0073110 | A1* | 3/2009 | Feng | G09G 3/3406 345/102 |
| 2009/0189842 | A1* | 7/2009 | Huang | G09G 3/342 345/102 |
| 2011/0007055 | A1* | 1/2011 | Wang | G09G 3/3426 345/211 |

FOREIGN PATENT DOCUMENTS

| CN | 102147093 A | 8/2011 |
| CN | 102625527 A * | 8/2012 |

(Continued)

OTHER PUBLICATIONS

International Search Report and Written Opinion dated Mar. 16, 2018 from State Intellectual Property Office of the P.R. China.
(Continued)

*Primary Examiner* — Raymond R Chai
(74) *Attorney, Agent, or Firm* — Dilworth & Barrese, LLP.; Michael J. Musella, Esq.

(57) ABSTRACT

A signal generating circuit and a signal generating method, a driving circuit of a light emitting device and a display device. The signal generating circuit includes: a control circuit, configured to calculate at least one of frequency control word information or duty-cycle control word information according to an instruction; and a pulse-width adjusting circuit, configured to generate a pulse signal according to the at least one of the frequency control word information or the duty-cycle control word information.

19 Claims, 9 Drawing Sheets

(51) Int. Cl.
*H03K 3/017* (2006.01)
*G09G 3/34* (2006.01)

(56) References Cited

FOREIGN PATENT DOCUMENTS

| CN | 102625527 A | 8/2012 |
| CN | 104284489 A | 1/2015 |
| JP | 2008109589 A | 5/2008 |

OTHER PUBLICATIONS

Liming Xiu, "From Frequency to Time-Average-Frequency, A Paradigm Shift in the Design of Electronic Systems", IEEE Press, 2015, pp. 1-179, John Wiley and Sons, Inc., Hoboken, New Jersey.
Liming Xiu, "Nanometer Frequency Synthesis Beyond the Phase-Locked Loop", IEEE Press, 2012, pp. 1-334, John Wiley and Sons, Inc., Hoboken, New Jersey.
"Dual Inverter—NL27WZ04-D", Semiconductor Components Industries, LLC. https://www.onsemi.com/pub/Collateral/NL27QZ04-D.PDF, Mar. 2013, pp. 1-6.

* cited by examiner

SIGNAL GENERATING CIRCUIT AND SIGNAL GENERATING METHOD, DRIVING CIRCUIT OF LIGHT EMITTING DEVICE AND DISPLAY DEVICE

The present application claims the priority of the Chinese Patent Application No. 201710197909.4 filed on Mar. 29, 2017, which is incorporated herein by reference in its entirety as part of the disclosure of the present application.

TECHNICAL FIELD

Embodiments of the present disclosure relate to a signal generating circuit and a signal generating method, a driving circuit of a light emitting device and a display device.

BACKGROUND

A light-emitting diode (LED) includes a PN junction. When a suitable voltage is applied to the light emitting diode, holes injected from a P region into an N region and electrons injected from the N region into the P region are recombined within a few micrometers near the PN junction to generate spontaneous radiation fluorescence (i.e., electroluminescence). Different semiconductor materials have different energy states for electrons and holes. The more energy is released when the electrons and the holes are recombined, the shorter a wavelength of the emitted light is.

As compared with an incandescent lamp, a LED lamp has many advantages, including but not limited to, lower energy consumption, a longer service life, higher reliability, a smaller size and a faster switching speed. The LED lamp is applied in a wide range, such as flight lighting, automobile headlights, advertising lighting and traffic signal displays and so on.

SUMMARY

Embodiments of the disclosure provide a signal generating circuit, comprising: a control circuit, configured to calculate at least one of frequency control word information or duty-cycle control word information according to an instruction; and a pulse-width adjusting circuit, configured to generate a pulse signal according to the at least one of the frequency control word information or the duty-cycle control word information.

For example, the pulse signal is a pulse signal having a fixed duty cycle and a variable frequency, a pulse signal having a variable duty cycle and a fixed frequency or a pulse signal having a fixed pulse width and a variable frequency.

For example, the control circuit includes an input circuit, a creating circuit, a calculating circuit, and an output circuit; the input circuit is configured to receive the instruction; the creating circuit is configured to generate information corresponding to the instruction; the calculating circuit is configured to calculate the at least one of the frequency control word information or the duty-cycle control word information according to information generated by the creating circuit; and the output circuit is configured to output the at least one of the frequency control word information or the duty-cycle control word information.

For example, the creating circuit includes a parameter identifying sub-circuit, configured to identify a change parameter of brightness according to the instruction.

For example, the creating circuit further includes a change-trend identifying sub-circuit, configured to identify a change trend of brightness according to the instruction.

For example, the creating circuit further includes a change-reference identifying sub-circuit, configured to identify a change reference of brightness according to the instruction.

For example, the creating circuit further includes a change amplitude identifying sub-circuit, configured to identify a change magnitude of brightness according to the instruction.

For example, the calculating circuit is configured to: calculate the at least one of the frequency control word information or the duty-cycle control word information according to at least one of the change parameter, the change trend, the change reference or the change amplitude of brightness.

For example, the calculating circuit is further configured to: determine a frequency of the pulse signal according to the change parameter, the change trend, the change reference or the change amplitude of brightness; and calculate the frequency control word information according to the frequency of the pulse signal.

For example, the calculating circuit is further configured to: determine a duty cycle change value of the pulse signal according to the change parameter, the change trend, the change reference or the change amplitude of brightness; and calculate the duty-cycle control word information according to the duty cycle change value.

For example, the pulse-width adjusting circuit is a time average frequency direct period synthesizer.

For example, the time average frequency direct period synthesizer is implemented by using a programmable logic device.

For example, the instruction includes at least one of a user instruction from a user or an instruction automatically generated by the signal generating circuit.

For example, the signal generating circuit further comprises a sensor, the sensor being configured for automatically generating the instruction.

Embodiments of the disclosure further provide a driving circuit of a light emitting device, comprising: a light emitting circuit, including a light emitting element; and the signal generating circuit described above, configured to drive the light emitting element to emit light.

For example, the light emitting circuit further includes a first voltage terminal, a switching element, and a second voltage terminal; a first terminal and a second terminal of the light emitting element is coupled to the first voltage terminal and a first electrode of the switching element, respectively; a second electrode of the switching element is coupled to the second voltage terminal; and a control electrode of the switching element is coupled to an output terminal of the signal generating circuit, so as to receive the pulse signal.

Embodiments of the disclosure further provide a display device, comprising the driving circuit of the light emitting device described above.

Embodiments of the disclosure further provide a signal generating method, comprising: calculating at least one of frequency control word information or duty-cycle control word information according to an instruction; and generating a pulse signal according to the at least one of the frequency control word information or the duty-cycle control word information.

For example, calculating the at least one of frequency control word information or duty-cycle control word information according to the instruction, includes: identifying at least one of a change parameter, a change trend, a change reference or a change amplitude of brightness according to the instruction; and calculating the at least one of the frequency control word information or the duty-cycle control word information according to the at least one of the change parameter, the change trend, the change reference or the change amplitude of brightness.

For example, the signal generating method further comprises: outputting the pulse signal to a light emitting element for driving the light emitting element to emit light.

For example, the pulse signal is a pulse signal having a fixed duty cycle and a variable frequency, a pulse signal having a variable duty cycle and a fixed frequency or a pulse signal having a fixed pulse width and a variable frequency.

For example, calculating the frequency control word information according to the at least one of the change parameter, the change trend, the change reference or the change amplitude of brightness, includes: determining a frequency of the pulse signal according to the change parameter, the change trend, the change reference or the change amplitude of brightness; and calculating the frequency control word information according to the frequency of the pulse signal.

For example, calculating the duty-cycle control word information according to the at least one of the change parameter, the change trend, the change reference or the change amplitude of brightness, includes: determining a duty cycle change value of the pulse signal according to the change parameter, the change trend, the change reference or the change amplitude of brightness; and calculating the duty-cycle control word information according to the duty cycle change value.

BRIEF DESCRIPTION OF THE DRAWINGS

In order to illustrate the technical solutions in the embodiments of the present disclosure or the existing arts more clearly, the drawings needed to be used in the description of the embodiments or the existing arts will be briefly described in the following; it is obvious that the drawings described below are only related to some embodiments of the present disclosure, for one ordinary skilled person in the art, other drawings can be obtained according to these drawings without making other inventive work.

DETAILED DESCRIPTION

Figure 1:
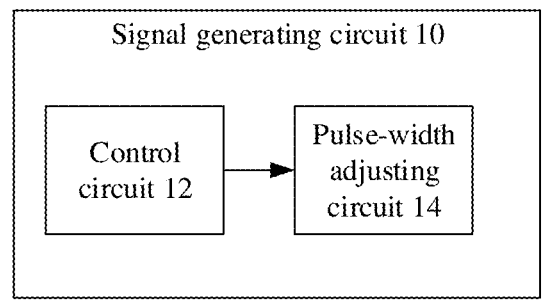
FIG. 1 is a first structural schematic diagram of a signal generating circuit provided by an embodiment of the present disclosure.

Hereafter, the technical solutions of the embodiments of the present disclosure will be described in a clearly and fully understandable way in connection with the drawings related to the embodiments of the disclosure. It is obvious that the described embodiments are just a part but not all of the embodiments of the present disclosure. Based on embodiments of the present disclosure, all other embodiments obtained by those skilled in the art without making other inventive work should be within the scope of the present disclosure.

In an electronic device, a driving circuit may be used for supplying power to an LED. The driving circuit needs to supply a sufficiently-large current, so that light emitted by the LED may meet requirements of brightness. However, the supplied current needs to be limited meanwhile, so as to avoid damage to the LED due to an excessively-large current. A small increase in a voltage applied to the LED may result in a significant increase in the current, and therefore, an accurate current source circuit is needed to supply power for LED lighting.

A pulse driving circuit may provide a pulse signal with a high current to drive a LED to emit light, thereby improving light emitting efficiency of the LED. Between two pulses, there is a short OFF period (e.g., there is a low level between two pulses of high levels), and during the OFF period, the LED stops emitting light, and a PN junction of the LED may also realize a cooling effect. As long as a flashing rate of the LED is higher than a human flicker fusion threshold, the LED does not appear to flash but appears to continue emitting light with respect to human vision. A pulse width modulation (PWM) may change a duty cycle of a pulse, and a PWM-based driving circuit is more effective than a driving circuit with a constant current or constant voltage, so that efficiency and performance of the LED may be improved.

A technology adopting a Time-Average-Frequency Direct Period Synthesis (TAF-DPS) may generate a pulse signal of any frequency. That is to say, a TAF-DPS synthesizer may realize a fine frequency measurement with small granularity. In addition, since each single pulse is directly constructed, an output frequency of the TAF-DPS synthesizer may be changed instantaneously, i.e., the TAF-DPS synthesizer may switch frequency rapidly. Capabilities of generating any frequency and switching frequency rapidly are advantages of the TAF-DPS synthesizer as compared with a conventional frequency source. Moreover, the TAF-DPS synthesizer may also adjust a duty cycle of the output signal, which may be used as a specific implementation approach for a pulse-width adjusting circuit in an embodiment of the present disclosure.

Embodiments of the present disclosure provide a signal generating circuit, a signal generating method, a driving circuit of a light emitting device and a display device. The signal generating circuit is configured to: receive an instruction; calculate at least one of frequency control word information or duty-cycle control word information according to the instruction; generate a pulse signal according to the at least one of the frequency control word information or the duty-cycle control word information; and output the pulse signal to a light emitting element (e.g., an LED), for driving the light emitting element to emit light. The signal generating circuit includes a control circuit and a pulse-width adjusting circuit, and a TAF-DPS synthesizer may be used as the pulse-width adjusting circuit to drive the light emitting element to emit light.

Advantages of the signal generating circuit, the signal generating method, the driving circuit of the light emitting device and the display device provided by the embodiments of the present disclosure include, but are not limited to:

(1) Low cost and flexibility of implementation. A signal generating circuit based on a TAF-DPS may be completely implemented using a digital design, and be burnt into a programmable logic device (e.g., FPGA) through HDL codes, so that parameters of the signal generating circuit may also be easily reset at any time. Therefore, it does not need to use a special dedicated circuit. Functions of the signal generating circuit may be realized by using a general FPGA or other programmable device. Of course, an ASIC may also be used to implement the functions of the signal generating circuit. The signal generating circuit may constitute an independent chip, and may also be integrated in other chips (e.g., a signal processing chip, a light emitting device chip, a video processing chip, a system on chip (SoC), etc.).

(2) High precision. A frequency/period of pulses output by the TAF-DPS may be precisely controlled, a frequency resolution thereof may be up to parts per billion, and a duty cycle thereof may also be precisely controlled. When the pulses output by the TAF-DPS are used for controlling a LED to emit light, performance of the LED may be improved.

(3) Interactivity. A user may input an instruction to indicate a desired light emitting effect of a LED (e.g., brightness to be increased, decreased, increased periodically or decreased periodically, etc.). The signal generating circuit may extract related parameters for generating a pulse signal by analyzing a user instruction, and then use these related parameters to generate the pulse signal, so that the light emitting effect desired by the user may be realized when the pulse signal is used to drive the LED to emit light. Of course, the instruction may also be automatically generated without user intervention. For example, the signal generating circuit may include a sensor for detecting ambient light; when the sensor senses that the ambient light is dimmed, the signal generating circuit may automatically generate an instruction of "increasing brightness", so that light emitting of the LED is enhanced to make up for the weakening of the ambient light.

It should be noted that, the advantages of the technical solutions provided by the embodiments of the present disclosure are not limited thereto, which will not be repeated in detail herein.

Hereinafter, the embodiments of the present disclosure will be described in detail with reference to the accompanying drawings.

As shown in FIG. 1, an embodiment of the present disclosure provides a signal generating circuit 10, comprising: a control circuit 12, configured to calculate at least one of frequency control word information or duty-cycle control word information according to an instruction; and a pulse-width adjusting circuit 14, configured to generate a pulse signal according to the at least one of the frequency control word information or the duty-cycle control word information. For example, the instruction includes a user instruction from a user and/or an instruction automatically generated by the signal generating circuit.

Figure 12:
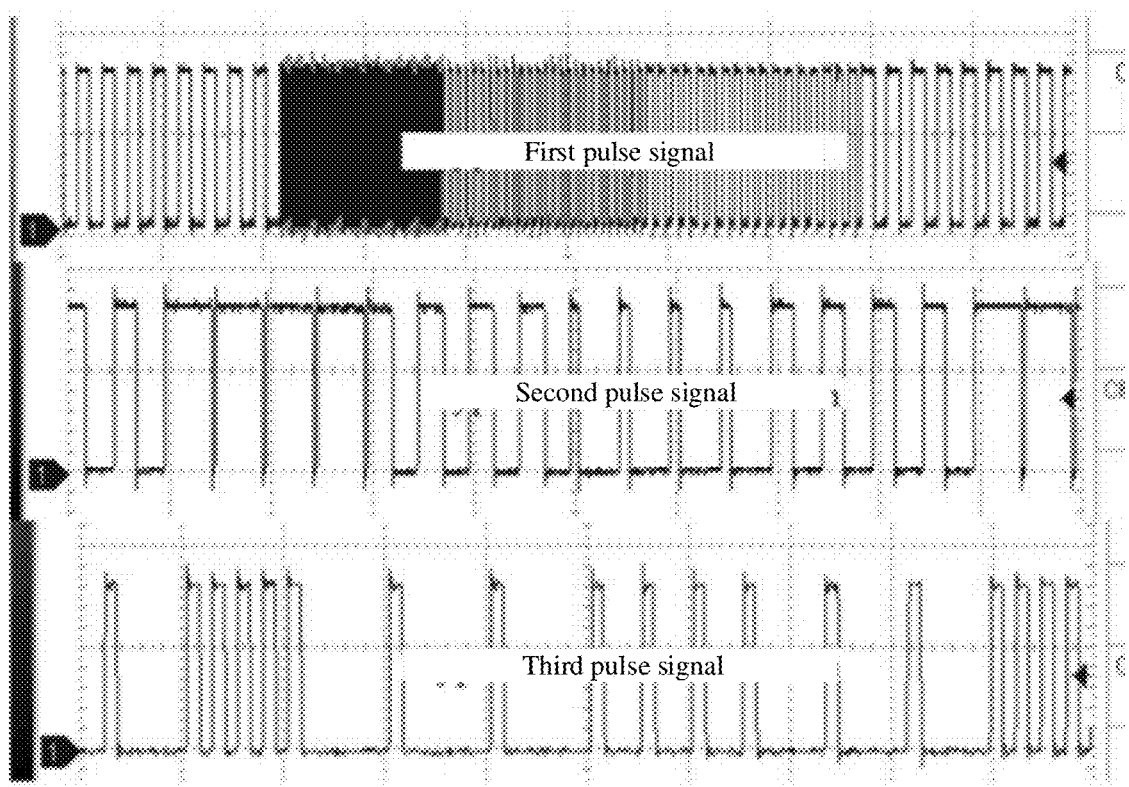
FIG. 12 is a schematic diagram of a variety of pulse signals provided by an embodiment of the present disclosure.

The pulse signal may be a pulse signal having a fixed duty cycle and a variable frequency, a pulse signal having a variable duty cycle and a fixed frequency or a pulse signal having a fixed pulse width and a variable frequency. For example, as shown in FIG. 12, the pulse signal may be a first pulse signal having a fixed duty cycle and a variable frequency. In the first pulse signal, a period of the signal is varied, and a duty cycle in each period is fixed. Alternatively, the pulse signal may be a second pulse signal having a variable duty cycle and a fixed frequency. In the second pulse signal, a period of the signal is fixed, and a duty cycle in each period is varied. Alternatively, the pulse signal may be a third pulse signal having a fixed pulse width and a variable frequency. In the third pulse signal, a width of each pulse is identical, and a period of the signal is varied, and a duty cycle in each period is also varied.

Figure 2:
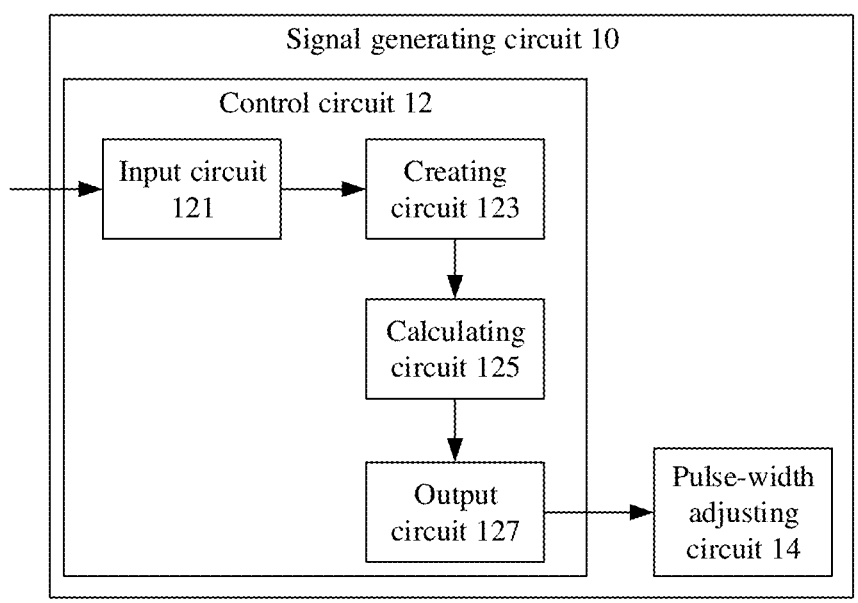
FIG. 2 is a second structural schematic diagram of a signal generating circuit provided by an embodiment of the present disclosure.

Referring to FIG. 2, the control circuit 12 includes an input circuit 121, a creating circuit 123, a calculating circuit 125 and an output circuit 127. The input circuit 121 is configured to receive the instruction; the creating circuit 123 is configured to generate information corresponding to the instruction; the calculating circuit 125 is configured to calculate at least one of the frequency control word information or the duty-cycle control word information according to the information generated by the creating circuit; and the output circuit 127 is configured to output the at least one of the frequency control word information or the duty-cycle control word information.

In some examples, the instruction is a user instruction received from a user to indicate a desired light emitting effect. The light emitting effect may be a display effect expected by the user on a display screen. For example, the light emitting effect may include that: display brightness is increased or decreased, display brightness is periodically increased or periodically decreased, display brightness is increased at first and then decreased, or decreased at first and then increased, and display brightness is changed with ambient light but total brightness is remained unchanged, brightness of some regions of the display screen is higher or lower than brightness of other regions, and the brightness of the display screen is changed every certain period of time. The light emitting effect desired by the user may also include other various categories, which are not limited by the present disclosure herein.

The user may input an instruction to the input circuit 121 to indicate the desired light emitting effect. For example, the input circuit 121 may include devices such as a microphone, a knob, a button, a touch screen, a somatosensory device, a camera, a sensor and the like, and the user may input one or more instructions into the input circuit 121 in an interactive mode such as sending a voice command, turning a knob, pressing a key, clicking on a touch screen, or conducting a body motion (e.g., waving hands) and so on.

For example, the signal generating circuit further includes a sensor, and the sensor is used for automatically generating the instruction. In some examples, the instruction may also be generated automatically without user intervention. For example, the signal generating circuit may include a sensor for detecting ambient light; when the sensor senses that the ambient light is dimmed, the signal generating circuit may automatically generate an instruction of "increasing brightness", so that light emitting of the LED is enhanced to make up for the weakening of the ambient light.

In other examples, the instructions may also include an instruction from a user and an instruction automatically generated by the signal generating circuit at the same time, which is not limited by the present disclosure herein.

Figure 3:
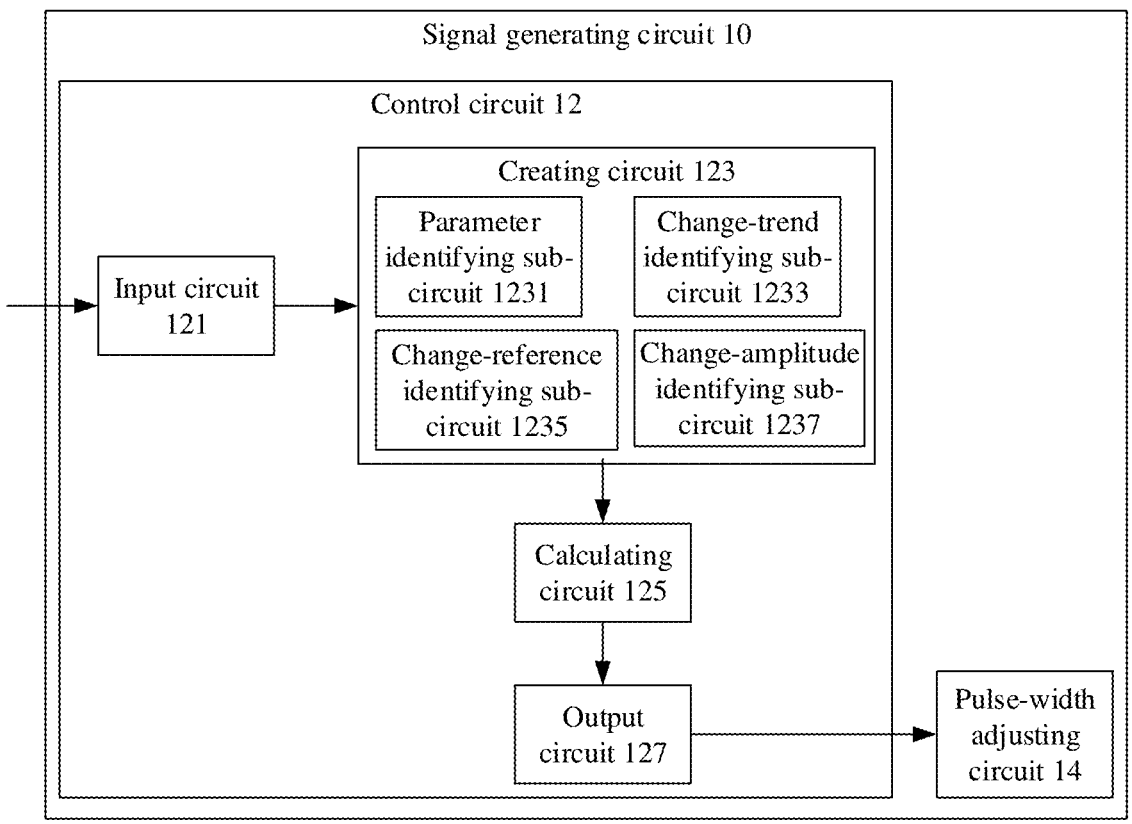
FIG. 3 is a third structural schematic diagram of a signal generating circuit provided by an embodiment of the present disclosure.

The creating circuit 123 is configured to analyze the instruction and generate parameter information corresponding to the instruction. Referring to FIG. 3, the creating circuit includes a parameter identifying sub-circuit 1231, configured to identify a change parameter of brightness according to the instruction. For example, the parameter identifying sub-circuit 1231 is configured to identify whether the user expects the display brightness to be changed or not according to the instruction.

Referring to FIG. 3, the creating circuit 123 further includes a change-trend identifying sub-circuit 1233, configured to identify a change trend of brightness according to the instruction. For example, the change-trend identifying sub-circuit 1233 is configured to identify whether the change trend of the brightness desired by the user is to be brighter or darker according to the instruction.

The creating circuit 123 further includes a change-reference identifying sub-circuit 1235, configured to identify a change reference of brightness according to the instruction. For example, the change-reference identifying sub-circuit 1235 is configured to identify a time interval for changing of the brightness desired by the user according to the instruction. For another example, the change reference of the brightness may be that the brightness is brighter or darker at a time interval T0. Alternatively, the change reference of the brightness may be that that the brightness is brighter at a time interval T0, and afterwards the original brightness is restored at a time interval T1. The present disclosure does not limit the change reference of the brightness herein.

The creating circuit 123 further includes a change-amplitude identifying sub-circuit 1237, configured to identify a change magnitude of the brightness according to the instruction. For example, the change-amplitude identifying sub-circuit 1237 is configured to identify the change magnitude of the brightness desired by the user according to the instruction. For example, the change magnitude of the brightness may be that, the changed brightness is higher (or lower) than the brightness before being changed by 5%, 10%, 15% and the like. The present disclosure does not limit the change magnitude of the brightness herein.

The calculating circuit 125 is configured to receive parameters (e.g., a change parameter, a change trend, a change reference or a change magnitude of brightness, etc.) from respective sub-circuits of the creating circuit 123. The calculating circuit 125 is configured to calculate at least one of the frequency control word information or the duty-cycle control word information according to at least one of the change parameter, the change trend, the change reference and the change amplitude of the brightness.

The frequency control word information is used for controlling a frequency of the pulse signal. The frequency control word information may be used by the pulse-width adjusting circuit 14 to generate a pulse signal, so that a frequency of the generated pulse signal is a desired frequency. The frequency of the generated pulse signal may be changed by changing the frequency control word information.

The duty-cycle control word information is used for controlling a duty cycle of the pulse signal. The duty-cycle control word information may be used by the pulse-width adjusting circuit 14 to generate a pulse signal, so that the duty cycle of the generated pulse signal is a desired duty cycle. The duty cycle of the generated pulse signal may be changed by changing the duty-cycle control word information.

For example, the calculating circuit 125 determines parameter information of the pulse signal based on the parameters related to the brightness (e.g., a change parameter, a change trend, a change reference, or a change magnitude of the brightness, etc.) from the creating circuit 123. The parameter information includes but is not limited to: a carrier frequency (fc), a modulation rate (fm) and a maximum frequency offset ($\Delta f$) of the pulse signal, a range of the duty cycle, a maximum offset ($\Delta R$) of the duty cycle, a change amount of a frequency of the pulse signal (e.g., the frequency is increased or decreased by 1%, 5%, etc.) and the like. The calculating circuit 125 generates frequency control word information and/or duty-cycle control word information according to the parameter information described above.

For example, when a change trend of the brightness desired by the user is to become brighter gradually, it may be achieved by increasing a frequency $f_{TAF}$ of the pulse signal while keeping a duty cycle unchanged, or by increasing the duty cycle of the pulse signal while keeping the frequency unchanged (i.e., in a case that the period is kept unchanged, a width of the pulse is increased, so that a time for driving a light emitting element to emit light in every period is prolonged). When the change trend of the brightness is to become darker gradually, it may be realized by decreasing the frequency $f_{TAF}$ of the pulse signal while keeping the duty cycle unchanged, or by decreasing the duty cycle of the pulse signal while keeping the frequency unchanged (i.e., in a case that the period is kept unchanged, a width of the pulse is decreased, so that a time for driving a light emitting element to emit light in every period is shortened).

Figure 4:
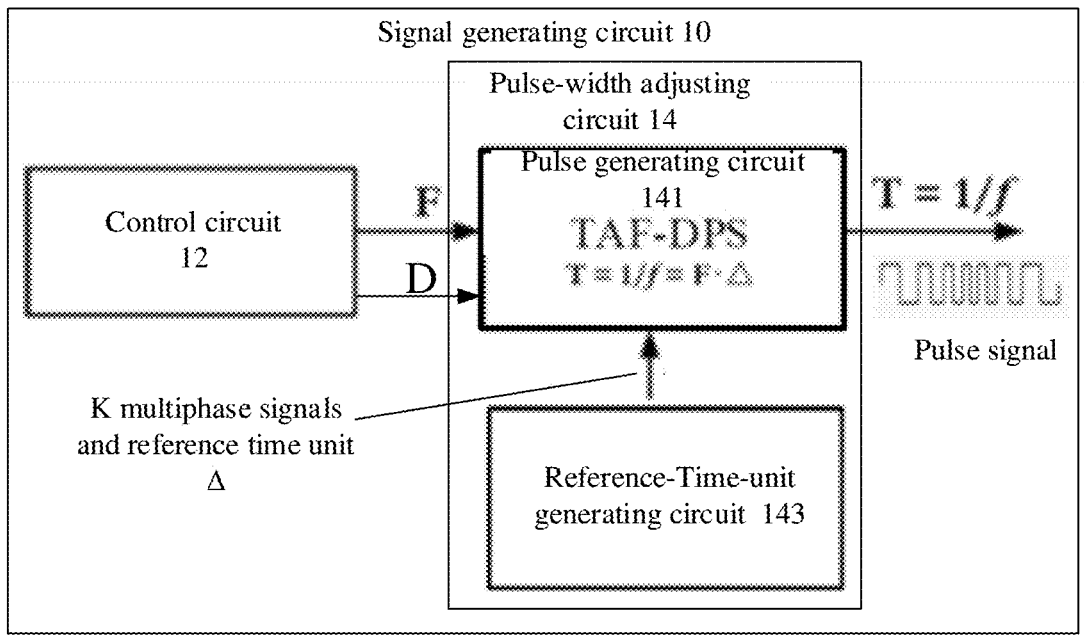
FIG. 4 is a fourth structural schematic diagram of a signal generating circuit provided by an embodiment of the present disclosure.
Figure 6:
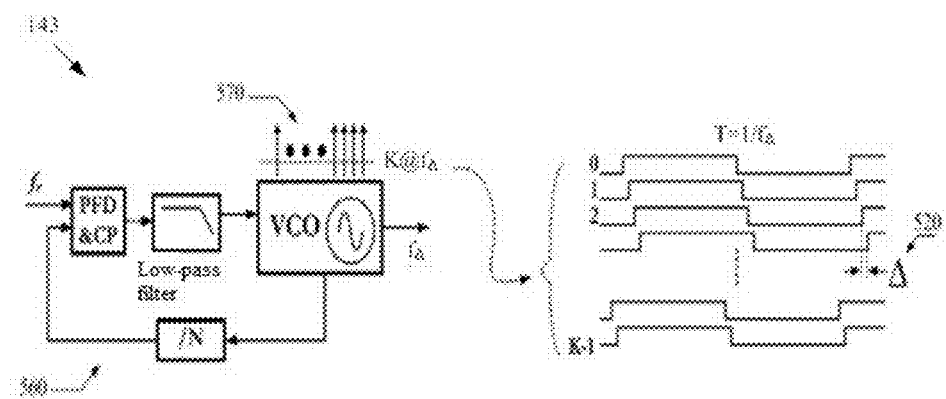
FIG. 6 is a structural schematic diagram of a reference-time-unit generating circuit provided by an embodiment of the present disclosure.

The calculating circuit 125 may calculate the frequency control word information F according to a formula (1) as follows:

$$F = K^*(f_{66}/f_{TAF}) \qquad \text{Formula (1)},$$

where K is a total number of signals having a uniform phase interval generated by a reference-time-unit generating circuit 143 in FIGS. 4 and 6 (e.g., K=16, 32, or any other numerical value), and $f_\Delta$ is an output frequency of a voltage controlled oscillator in FIG. 6. In some examples, $f_\Delta$ is a carrier frequency fc. It should be noted that, a circuit structure on a left side of FIG. 6 is only an exemplary implementation of the reference-time-unit generating circuit 143, and the structure of the reference-time-unit generating circuit 143 is not limited thereto, and may also be constructed from other circuit structures, which is not limited by the present disclosure herein.

For example, it is assumed that a frequency $f_{TAF}$ of the current pulse signal is 5 MHz, an output frequency $f\Delta$ of the voltage-controlled oscillator is 5 MHz, and the number K of signals having a uniform phase interval generated by the reference-time-unit generating circuit 143 is 16 (K=16), and according to the formula (1), current frequency control word information may be calculated as F=16*(5 MHz/5 MHz) =16. When a change trend of the brightness is to become brighter gradually, the calculating circuit 125 determines to increase the frequency $f_{TAF}$ of the pulse signal to 5.025 MHz, and according to the formula (1), the frequency control word information may be calculated as F=16*(5 MHz/5.025 MHz)=15.9203980099. When a change trend of the brightness is to become darker gradually, the calculating circuit 125 determines to decrease the frequency $f_{TAF}$ of the pulse signal to 4.975 MHz, and according to the formula (1), the frequency control word information may be calculated as F=16*(5 MHz/4.975 MHz)=16.0804020300. That is to say, the calculating circuit 125 may determine the frequency $f_{TAF}$ of the pulse signal according to the change parameter, the change trend, the change reference or the change amplitude of the brightness and the like; and then the calculating circuit 125 may calculate and obtain the value of the frequency control word information F through the formula (1) according to the known output frequency $f_A$ of the voltage-controlled oscillator and the number K of signals having a uniform phase interval.

In some examples, the calculating circuit 125 may determine a duty cycle change value of a pulse signal according to a change parameter, a change trend, a change reference or a change amplitude of brightness; then, the calculating circuit 125 may calculate a value of the duty-cycle control word information D according to the duty cycle change value. For example, assume that the change trend of the brightness desired by the user is to be increased, and current duty-cycle control word information is D0 (e.g., D0 may be an initial value of the duty-cycle control word information, and may also be another value set by the user). In order to achieve the brightness change desired by the user, the calculating circuit 125 determines to gradually increase the duty-cycle control word information on the basis of the current duty-cycle control word information D0, so as to gradually increase the duty cycle of the pulse signal, so that a light emitting intensity of the light emitting element may be increased gradually. Alternatively, when the change trend of the brightness desired by the user is to be weakened, the calculating circuit 125 determines to gradually decrease the duty-cycle control word information on the basis of the current duty-cycle control word information D0, so as to gradually decrease the duty cycle, so that the light emitting intensity of the light emitting element may be decreased gradually.

For another example, it is assumed that a maximum offset of the duty cycle R is ΔR, and current duty-cycle control word information is D0 with a corresponding duty cycle is R0. In order to quickly realize change of brightness desired by the user (e.g., to be brighter), a duty cycle of the pulse signal may be increased by half of the maximum offset on the basis of R0 to become R1 (the duty cycle R1=R0+ΔR/2), and then the duty cycle is continuously fine tuned on the basis of R1 (e.g., the duty cycle is gradually increased or decreased), so that the light emitting element may quickly meet requirements of the brightness of the user. Of course, after the duty cycle becomes R1, it is also possible not to perform fine tuning but to continuously increase the duty cycle by ΔR/4 to become R2 (the duty cycle R2=R1+ΔR/4), and then the duty cycle is continuously fine tuned on the basis of R2 (e.g., the duty cycle is gradually increased or decreased). Similarly, by rapidly adjusting the duty cycle, the light emitting intensity of the light emitting element may quickly meet the requirements of the brightness of the user.

Correspondingly, since the duty cycle is controlled by the duty-cycle control word information, in order to realize rapid change of the duty cycle of the pulse wave, the calculating circuit 125 firstly increases the duty-cycle control word information to the duty-cycle control word information D1 corresponding to R1 on the basis of the current duty-cycle control word information D0 (i.e., D1 is the duty-cycle control word information corresponding to the duty cycle R1=R0+ΔR/2), and then continuously fine tunes the duty-cycle control word information on the basis of D1 (e.g., the duty-cycle control word information is gradually increased or decreased on the basis of D1). Of course, on the basis that the duty-cycle control word information is increased to D1, fine adjustment may not be performed, but the duty-cycle control word information may be continuously increased to the duty-cycle control word information D2 corresponding to the duty cycle R2. (i.e., D2 is the duty-cycle control word information corresponding to the duty cycle R2=R0+ΔR/2+ΔR/4=R1+ΔR/4), and then the duty-cycle control word information is continuously fine tuned on the basis of D2 (e.g., the duty-cycle control word information is gradually increased or decreased on the basis of D2). By performing similar operations, the duty cycle of the pulse signal may be changed rapidly by adjusting the duty-cycle control word information rapidly, so that the light emitting intensity of the light emitting element may quickly meet the requirements of the user. The output circuit 127 is configured to receive the frequency control word information F and/or the duty-cycle control word information D from the calculating circuit 125, and output the frequency control word information F and/or the duty-cycle control word information D to the pulse-width adjusting circuit 14.

Referring to FIG. 4, the pulse-width adjusting circuit 14 includes a pulse generating circuit 141 and a reference-time-unit generating circuit 143. The reference-time-unit generating circuit 143 generates and outputs K multiphase signals and a reference time unit Δ. The pulse generating circuit 141 receives frequency control word information F and/or duty-cycle control word information D from the control circuit 12, and the pulse generating circuit 141 also receives the K multiphase signals and the reference time unit Δ from the reference-time-unit generating circuit 143, and the pulse generating circuit 141 generates and outputs a pulse signal that matches with the frequency control word information F and/or the duty-cycle control word information D.

The pulse-width adjusting circuit 14 is a time average frequency direct period synthesizer (TAF-DPS). The TAF-DPS may be implemented by using a programmable logic device (e.g., an ASIC or an FPGA). Alternatively, the time average frequency direct period synthesizer may be implemented by using an analog circuit device, which is not limited by the present disclosure herein.

Hereinafter, a working principle of the TAF-DPS-based pulse-width adjusting circuit will be described with reference to FIG. 5.

Figure 5:
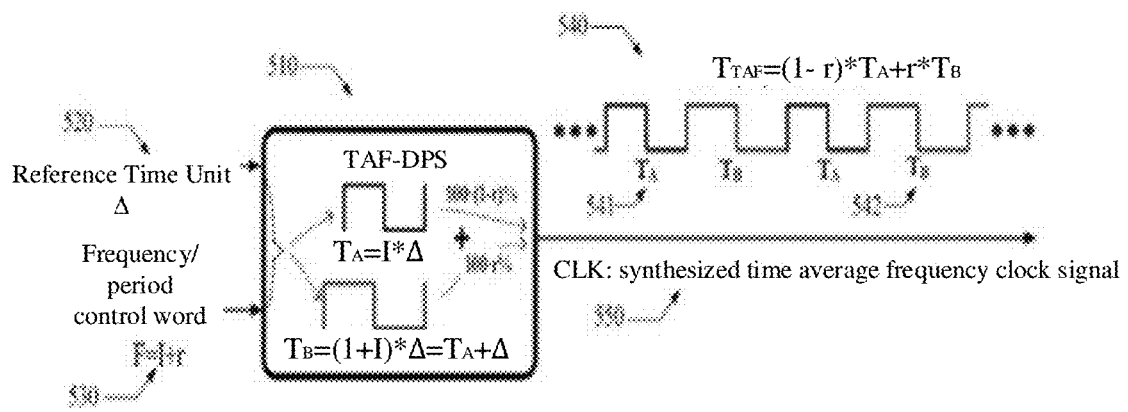
FIG. 5 is a schematic diagram of a working principle of a pulse-width adjusting circuit provided by an embodiment of the present disclosure.

In FIG. 5, the TAF-DPS-based pulse-width adjusting circuit is marked as a TAF-DPS 510, which has two inputs: a reference time unit Δ 520 and a frequency/period control word (F) 530, where F=I+r, I is an integer greater than 1 and r is a fraction. The TAF-DPS 510 has an output CLK 550. The CLK 550 is a synthesized time average frequency clock signal. Starting from the reference time unit 520, the TAF-DPS 510 generates two types of periods $T_A$=I*Δ and $T_B$=(I+1)*Δ. The output CLK is a clock pulse series 540 including two types of periods $T_A$ 541 and $T_B$ 542. They are used in an interwoven mode. The fraction r identifies a probability of occurrence of the period type $T_B$, so that r also determines a probability of occurrence of the $T_A$.

Specifically, as shown in FIG. 5, the period $T_{TAF}$ of the output CLK may be expressed by the following formula:

$$T_{TAF} = (1-r)*T_A + r*T_B =$$
$$T_A + r*(T_B - T_A) = T_A + r*\Delta = I*\Delta + r*\Delta = (I+r)*\Delta$$

Formula (2)

Therefore, when the control word F=I+r, it may be obtained that:

$$T_{TAF}=F*\Delta \quad \text{Formula (3)}$$

According to the above formula (3), the period $T_{TAF}$ of the output clock signal CLK of the TAF-DPS 510 is linearly proportional to the control word F. When the generated control word F is changed, the period $T_{TAF}$ of the output clock signal of the TAF-DPS 510 may also be changed in a same way.

In addition, since the period T is inversely proportional to the frequency f, when a predetermined condition is satisfied, for example, when a change amount of the control word F is slightly (less than a predetermined threshold), a frequency of the output clock signal may also be changed with a waveform of the frequency control word in a linear way approximately. Therefore, the control circuit 12 may determine characteristics of changes in a frequency of the pulse signal according to desired characteristics of changes in the brightness, and then generate frequency control word information having same or similar characteristics of changes according to the characteristics of the changes in the frequency of the pulse signal, so that the TAF-DPS 510 can generate a pulse signal having the desired characteristics of changes in frequency.

Hereinafter, a structure of the reference-time-unit generating circuit 143 is described with reference to FIG. 6. As shown in FIG. 6, the reference-time-unit generating circuit 143 includes:

a voltage controlled oscillator (VCO) 570, configured to oscillate at a predetermined oscillation frequency;

a phase locked loop circuit 560, configured to lock an output frequency of the voltage controlled oscillator 570 as an output frequency (fΔ); and K output terminals, configured to output K output signals having a uniform phase interval, where K is a positive integer greater than 1. The frequencies of the K output signals having a uniform phase interval are all fΔ.

Specifically, the reference time unit Δ 520 is typically generated by a multi-stage voltage controlled oscillator 570. Δ is a time span between outputs of any two adjacent voltage controlled oscillators. The voltage controlled oscillator 570 may be locked to a reference frequency with a known frequency value by a phase locked loop (PLL) 560. For example, the output frequency $f_\Delta$ of the voltage controlled oscillator is a known value. The reference time unit Δ may be calculated by using the following formula:

$$\Delta=T_\Delta/K=1/(K \cdot f_\Delta) \quad \text{Formula (4)}$$

Hereinafter, a structure of the pulse generating circuit 141 is described with reference to FIG. 7. For example, the pulse generating circuit 141 includes: a multiplexing circuit 72, configured for receiving the K output signals having a uniform phase interval from the reference-time-unit generating circuit 143; a first logic control circuit 70, configured for receiving the frequency control word information F from the control circuit 12; a second logic control circuit 74, configured for receiving the duty-cycle control word information D from the control circuit 12; and an output circuit 76, configured for outputting the generated pulse signal.

Figure 7:
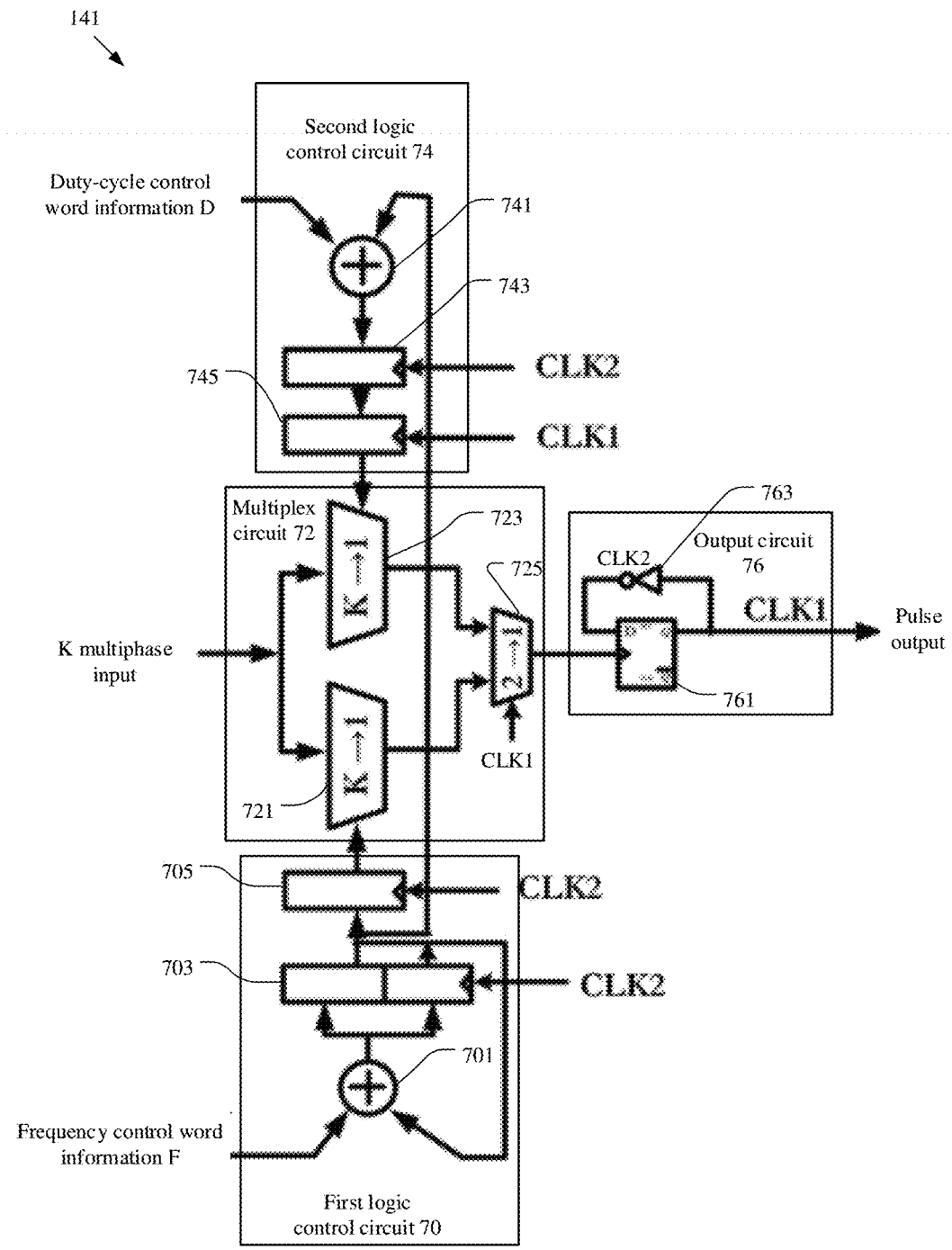
FIG. 7 is a structural schematic diagram of a pulse-width adjusting circuit provided by an embodiment of the present disclosure.

As shown in FIG. 7, in one embodiment, the multiplexing circuit 72 includes:

a first K→1 multiplexer 721 and a second K→1 multiplexer, each respectively including: a plurality of input terminals for receiving K signals that are evenly spaced in phase, a control input terminal and an output terminal; and a 2→1 multiplexer 725, including a first input terminal for receiving an output from the first K→1 multiplexer 721, a second input terminal for receiving an output from the second K→1 multiplexer 723, a control input terminal and an output terminal.

The output circuit 76 includes a D trigger 761 and an inverter 763. The D trigger 761 includes: a clock input terminal for receiving an output from the output terminal of the 2→1 multiplexer 725, a data input terminal, and an output terminal for outputting a first clock signal CLK1. The inverter 763 includes: an input terminal for receiving the first clock signal CLK1 and an output terminal for outputting a second clock signal CLK2, wherein the second clock signal is coupled to the data input terminal of the D trigger, and the first clock signal includes the pulse signal.

An output terminal of the output circuit 76 is used for outputting the first clock signal CLK1 as the pulse signal. The pulse signal is a pulse signal having a fixed duty cycle and a variable frequency, a pulse signal having a variable duty cycle and a fixed frequency or a pulse signal having a fixed pulse width and a variable frequency.

The first logic control circuit 70 includes an adder 701, a register 703 and a register 705. The second logic control circuit 74 includes an adder 741, a register 743 and a register 745.

The adder 701 adds the frequency control word information F and most significant bits (e.g., 5 bits) stored in the register 703, and then stores the added result in the register 703 in a rising edge of CLK2; or, the adder 701 adds the frequency control word information F and all information stored in the register 703, and then stores the added result in the register 703 in the rising edge of CLK2. In a next rising edge of CLK2, a most significant bit stored in the register 703 may be stored in the register 705 and used as a selection signal for the first K→1 multiplexer 721, for selecting a signal from K multiphase input signals as a first output signal of the first K→1 multiplexer 721.

The adder 741 adds the duty-cycle control word information D and the most significant bits stored in the register 703, and then stores the added result in the register 743 in a rising edge of CLK2. In a next rising edge of CLK2, information stored in the register 743 may be stored in the register 745 and used as a selection signal for the second K→1 multiplexer 723, for selecting a signal from the K multiphase input signals as a second output signal of the second K→1 multiplexer 723.

In a rising edge of CLK1, the 2→1 multiplexer 725 selects one of the first output signal from the first K→1 multiplexer 721 and the second output signal from the second K→1 multiplexer 723 as an output signal of the 2→1 multiplexer 725, which is used as an input clock signal of the D trigger 761.

For example, the frequency control word information is set in a form of F=I+r, where I is an integer in a range of [2, 2K] and r is a fraction in a range of [0, 1).

In addition, regarding the working principle of the TAF-DPS, reference may be made to L. XIU, "Nanometer Frequency Synthesis beyond the Phase-Locked Loop", Piscataway, N.J. 08854, USA, John Wiley IEEE-press, 2012, and L. XIU, "From Frequency to Time-Average-Frequency: a Paradigm Shift in the Design of Electronic System", Piscataway, N.J. 08854, USA, John Wiley IEEE-press, 2015, which are hereby incorporated by reference in their entirety.

Figure 8:
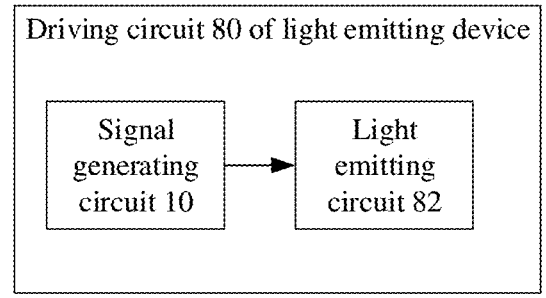
FIG. 8 is a first structural schematic diagram of a driving circuit of a light emitting device provided by an embodiment of the present disclosure.

As shown in FIG. 8, an embodiment of the present disclosure provides a driving circuit 80 of a light emitting device, which comprises: a light emitting circuit 82 and the signal generating circuit 10 according to an embodiment of the present disclosure. The light emitting circuit 82 includes a light emitting element, and the signal generating circuit 10 is configured to provide a pulse signal to drive the light emitting element to emit light.

Figure 9A:
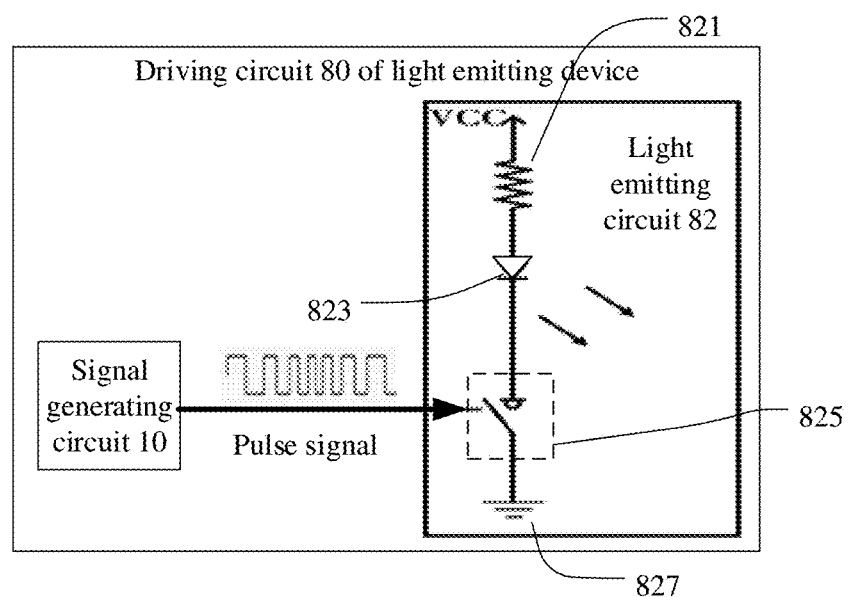
FIG. 9A is a second structural schematic diagram of a driving circuit of a light emitting device provided by an embodiment of the present disclosure.
Figure 9B:
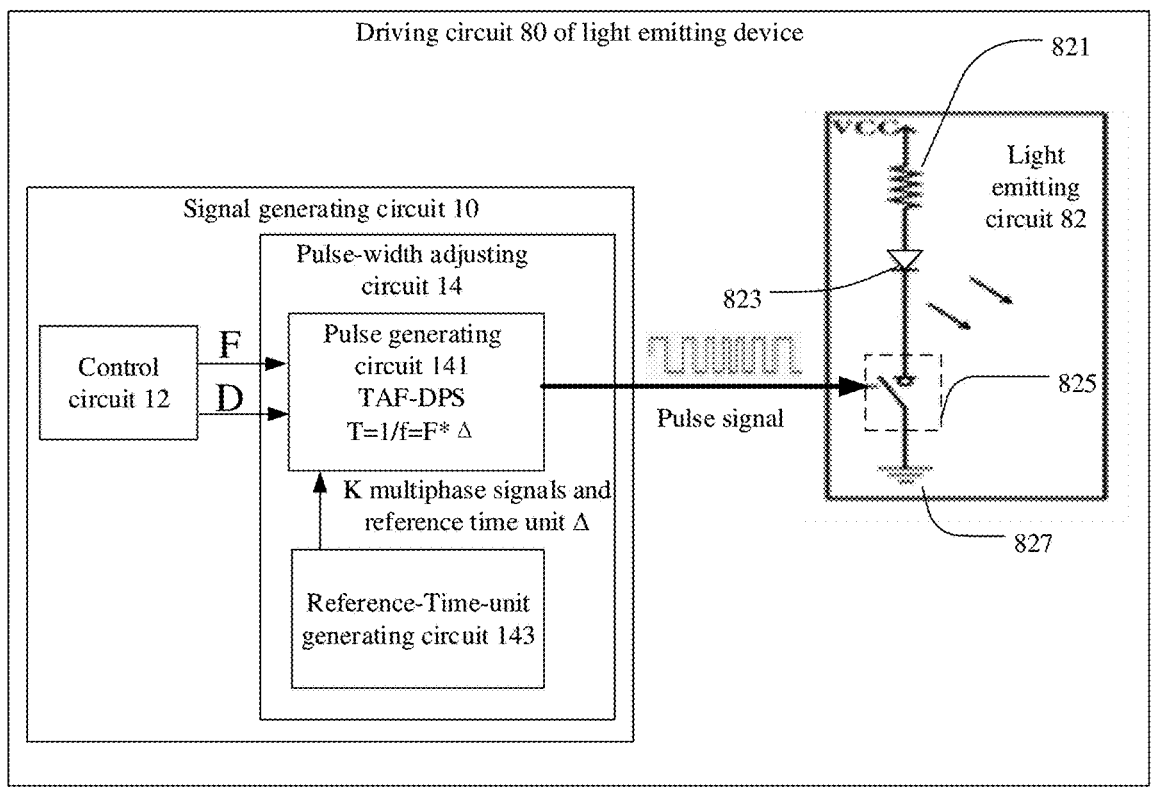
FIG. 9B is a third structural schematic diagram of a driving circuit of a light emitting device provided by an embodiment of the present disclosure.

As shown in FIGS. 9A and 9B, for example, the light emitting circuit 82 includes a first voltage terminal VCC, a resistor 821, a light emitting element 823, a switching element 825, and a second voltage terminal 827. A first terminal and a second terminal of the light emitting element 823 are respectively coupled to the first voltage end VCC and a first electrode of the switching element 825. For example, the first terminal of the light emitting element 823 is coupled to the first voltage terminal VCC through the resistor 821. The second electrode of the switch element is coupled to the second voltage terminal 827. The control electrode of the switch element 825 is coupled to an output terminal of the signal generating circuit 10, so as to receive the pulse signal.

For example, the light emitting element 823 is an LED, and the switching element 825 is a thin film transistor. The control electrode of the switching element 825 is a gate electrode of the thin film transistor; one of a first electrode and a second electrode of the switching element 825 is a source electrode of the thin film transistor, and the other is a gate electrode of the thin film transistor. The first voltage terminal VCC provides a voltage VCC, and the second voltage terminal 827 is a ground terminal.

An embodiment of the present disclosure further provides a display device, which comprises the driving circuit of the light emitting device and other devices (e.g., an array substrate, a color filter substrate, etc.) described above.

Figure 10:
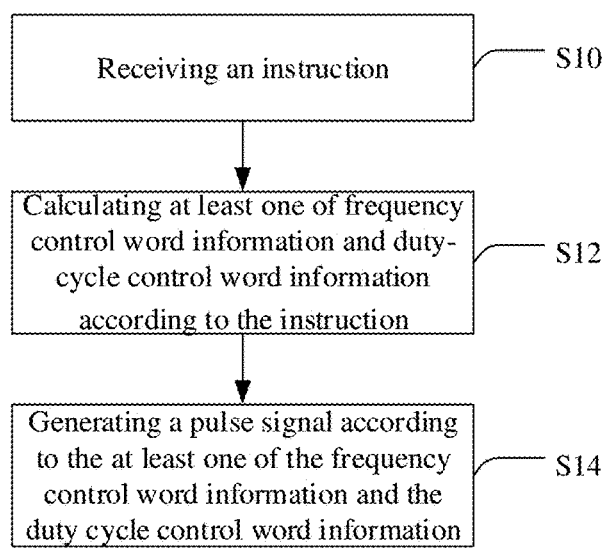
FIG. 10 is a first flowchart of a signal generating method provided by an embodiment of the present disclosure.

With reference to FIG. 10, an embodiment of the present disclosure further provides a signal generating method, applied to the signal generating circuit described above. The signal generating method comprises:

Step S10: receiving an instruction;

Step S12: calculating at least one of frequency control word information or duty-cycle control word information according to the instruction; and Step S14: generating a pulse signal according to the at least one of the frequency control word information or the duty-cycle control word information.

Figure 11:
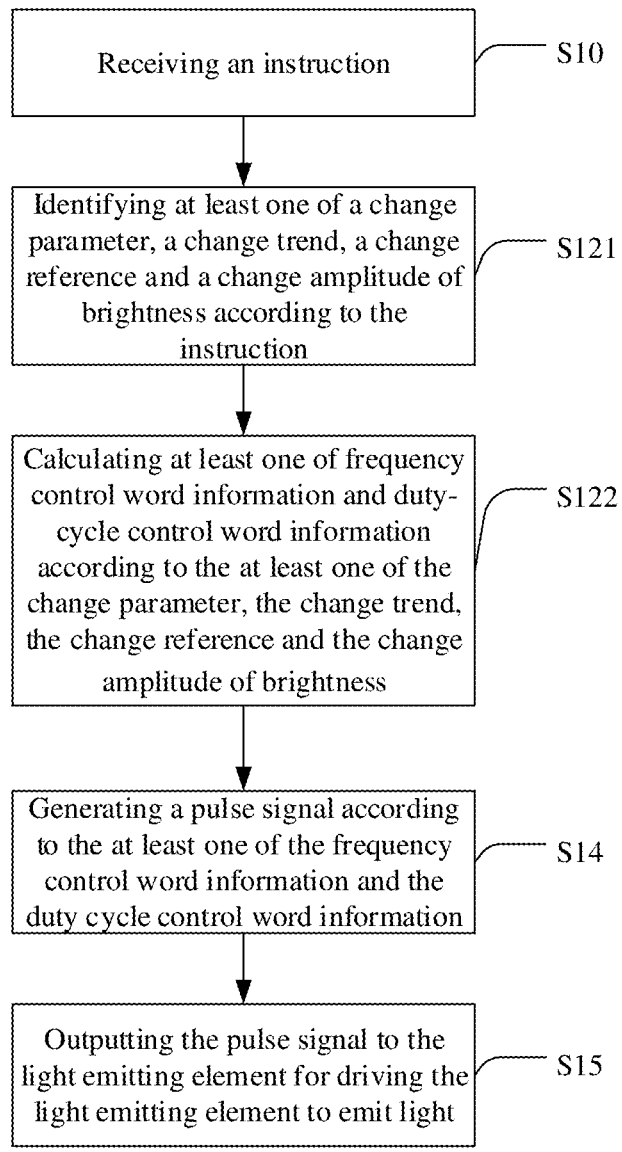
FIG. 11 is a second flowchart of a signal generating method provided by an embodiment of the present disclosure.

With reference to FIG. 11, an embodiment of the present disclosure further provides another signal generating method. The signal generating method comprises:

Step S10: receiving an instruction;

Step S121: identifying at least one of a change parameter, a change trend, a change reference or a change amplitude of brightness according to the instruction;

Step S122: calculating at least one of the frequency control word information or the duty-cycle control word information according to the at least one of the change parameter, the change trend, the change reference and the change amplitude of the brightness;

Step S14: generating a pulse signal according to the at least one of the frequency control word information or the duty-cycle control word information; and Step S15: outputting the pulse signal to the light emitting element for driving the light emitting element to emit light.

It should be noted that, the signal generating methods shown in FIG. 10 and FIG. 11 may be implemented by the signal generating circuit 10 in any embodiment of the present disclosure, and similar operations or steps will not be described herein.

A signal generating circuit, a signal generating method, a driving circuit of a light emitting device and a display device provided in the embodiments of the present disclosure have characteristics of low cost, flexibility, high precision and strong interactivity. For example, the signal generating circuit may be implemented by using a programmable logic device, a user may reset relevant parameters at any time, and the signal generating circuit does not need to be implemented using a special dedicated circuit. A frequency/period of a generated pulse signal may be precisely controlled, and a duty cycle of the pulse signal may also be precisely controlled. When the pulse signal is used to drive a light emitting element to emit light, performance of the light emitting element may be improved. By a user instruction, it is also possible to make the light emitting element realize any lighting effect desired by the user.

In the present disclosure, terms such as "first", "second" and the like used in the present disclosure do not indicate any sequence, quantity or significance but only for distinguishing different constituent parts. Also, the terms such as "a," "an," or "the" etc., are not intended to limit the amount, but indicate the existence of at least one. The terms "comprises," "comprising," "includes," "including," etc., are intended to specify that the elements or the objects stated before these terms and encompass the elements or the objects and equivalents thereof listed after these terms, but do not preclude the other elements or objects.

Obviously, those skilled in the art may modify the disclosure in various ways without breaking away from the spirits and scope of the disclosure. And so, if these changes and variations of the disclosure also fall within the scope of the claims or their equivalent technologies, the disclosure intends to include these changes and variations.

What are described above is related to the illustrative embodiments of the disclosure only and not limitative to the scope of the disclosure; any changes or replacements easily for those technical personnel who are familiar with this technology in the field to envisage in the scopes of the disclosure, should be in the scope of protection of the present disclosure. Therefore, the scopes of the disclosure are defined by the accompanying claims.

What is claimed is:

1. A signal generating circuit, comprising:
a control circuit, configured to calculate at least one of frequency control word information or duty-cycle word information according to an instruction; and
a pulse-width adjusting circuit, configured to generate a pulse signal according to the at least one of the frequency control word information or the duty-cycle control word information, wherein
the frequency control word information is used for controlling a frequency of the pulse signal, and the duty cycle control word information is used for controlling a duty cycle of the pulse signal, and wherein
the pulse-width adjusting circuit is a time average frequency direct period synthesizer.

2. The signal generating circuit according to claim 1, wherein the pulse signal is a pulse signal having a fixed duty cycle and a variable frequency, a pulse signal having a variable duty cycle and a fixed frequency or a pulse signal having a fixed pulse width and a variable frequency.

3. The signal generating circuit according to claim 1, wherein the control circuit includes an input circuit, a creating circuit, a calculating circuit, and an output circuit;
the input circuit is configured to receive the instruction;
the creating circuit is configured to generate information corresponding to the instruction;
the calculating circuit is configured to calculate the at least one of the frequency control word information or the duty-cycle control word information according to information generated by the creating circuit; and the output circuit is configured to output the at least one of the frequency control word information or the duty-cycle control word information.

4. The signal generating circuit according to claim 3, wherein the creating circuit includes a parameter identifying sub-circuit, configured to identify a change parameter of brightness of a light emitting element according to the instruction.

5. The signal generating circuit according to claim 4, wherein the creating circuit further includes a change-trend identifying sub-circuit, configured to identify a change trend of the brightness of the light emitting element according to the instruction, and the change trend comprises to be brighter or darker.

6. The signal generating circuit according to claim 5, wherein the creating circuit further includes a change-reference identifying sub-circuit, configured to identify a change reference of the brightness of the light emitting element according to the instruction, and the change reference comprises a time interval for changing the brightness of the light emitting element.

7. The signal generating circuit according to claim 6, wherein the creating circuit further includes a change amplitude identifying sub-circuit, configured to identify a change amplitude of the brightness of the light emitting element according to the instruction, and the change amplitude comprises a ratio of a difference between brightness of the light emitting element before being changed and brightness of the light emitting element after being changed to the brightness the light emitting element before king changed.

8. The signal generating circuit according to claim 7, wherein the calculating circuit is configured to: calculate the at least one of the frequency control word information or the duty-cycle control word information according to at least one of the change parameter, the change trend, the change reference or the change amplitude of the brightness of the light emitting element.

9. The signal generating circuit according to claim 8, wherein the calculating circuit is further configured to:
determine a frequency of the pulse signal according to the at least one of the change parameter, the change trend, the change reference or the change amplitude of the brightness of the light emitting element; and
calculate the frequency control word information according to the frequency of the pulse signal.

10. The signal generating circuit according to claim 8, wherein the calculating circuit is further configured to:
determine a duty cycle change value of the pulse signal according to the at least one of the change parameter, the change trend, the change reference or the change amplitude of the brightness of the light emitting element; and
calculate the duty-cycle control word information according to the duty cycle change value.

11. The signal generating circuit according to claim 1, wherein
the time average frequency direct period synthesizer is implemented by using a programmable logic device.

12. The signal generating circuit according to claim 1, wherein the instruction includes at least one of a user instruction from a user or an instruction automatically generated by the signal generating circuit.

13. The signal generating circuit according to claim 12, further comprising a sensor, the sensor being configured for automatically generating the instruction.

14. A driving circuit of a light emitting device, comprising:
a light emitting circuit, including a light emitting element; and
the signal generating circuit according to claim 1, configured to drive the light emitting element to emit light.

15. The driving circuit of the light emitting device according to claim 14, wherein the light emitting circuit further includes a first voltage terminal, a switching element, and a second voltage terminal;
a first terminal and a second terminal of the light emitting element is coupled to the first voltage terminal and a first electrode of the switching element, respectively;
a second electrode of the switching element is coupled to the second voltage terminal; and
a control electrode of the switching element is coupled to an output terminal of the signal generating circuit, so as to receive the pulse signal.

16. A display device, comprising the driving circuit of the light emitting device according to claim 14.

17. A signal generating method, comprising:
calculate at least one of frequency control word information or duty-cycle word information according to an instruction; and
generate, by a pulse-width adjusting circuit that is a time average frequency direct period synthesizer, a pulse signal according to the at least one of the frequency control word information or the duty-cycle control word information, wherein
the frequency control word information is used for controlling a frequency of the pulse signal, and the duty cycle control word information is used for controlling a duty cycle of the pulse signal.

18. The signal generating method according to claim 17, wherein calculating the at least one of frequency control word information or duty-cycle control word information according to the instruction, includes:
identifying at least one of a change parameter, a change trend, a change reference or a change amplitude of brightness of a light emitting element according to the instruction in the change trend comprises to be brighter or darker, the change reference comprises a time interval for changing the brightness of the light emitting element, and the change amplitude comprises a ratio of a difference between brightness of the light emitting element before being changed and brightness of the light emitting element after being changed to the brightness the light emitting element before being changed; and
calculating the at least one of the frequency control word information or the duty-cycle control word information according to the at least one of the change parameter, the change trend, the change reference or the change amplitude of the brightness of the light emitting element.

19. The signal generating method according to claim 18, wherein calculating the at least one of the frequency control word information or the duty-cycle control word information according to the at least one of the change parameter, the change trend, the change reference or the change amplitude of the brightness of the light emitting element, includes:
determining a frequency of the pulse signal according to the change parameter, the change trend, the change reference or the change amplitude of the brightness of the light emitting element;

calculating the frequency control word information according to the frequency of the pulse signal; alternatively determining a duty cycle change value of the pulse signal according to the change parameter, the change trend, the change reference or the change amplitude of the brightness of the light emitting element; and calculating the duty-cycle control word information according to the duty cycle change value.

* * * * *